United States Patent
Kapoor

(10) Patent No.: US 7,224,205 B2
(45) Date of Patent: May 29, 2007

(54) APPARATUS AND METHOD FOR IMPROVING DRIVE-STRENGTH AND LEAKAGE OF DEEP SUBMICRON MOS TRANSISTORS

(75) Inventor: Ashok Kumar Kapoor, Palo Alto, CA (US)

(73) Assignee: Semi Solutions, LLC, Palo Alto, CA (US)

( * ) Notice: Subject to any disclaimer, the term of this patent is extended or adjusted under 35 U.S.C. 154(b) by 157 days.

(21) Appl. No.: 11/029,542

(22) Filed: Jan. 4, 2005

(65) Prior Publication Data

US 2006/0006923 A1 Jan. 12, 2006

Related U.S. Application Data

(60) Provisional application No. 60/601,979, filed on Aug. 17, 2004, provisional application No. 60/585,582, filed on Jul. 7, 2004.

(51) Int. Cl.
*H03K 3/01* (2006.01)
(52) U.S. Cl. .................. 327/534; 327/537; 257/200; 257/347; 257/402
(58) Field of Classification Search ............ None
See application file for complete search history.

(56) References Cited

U.S. PATENT DOCUMENTS

| | | | |
|---|---|---|---|
| 5,821,769 A | 10/1998 | Douseki | |
| 6,034,563 A | 3/2000 | Mashiko | |
| 6,225,827 B1 * | 5/2001 | Fujii et al. | 326/98 |
| 6,384,639 B1 | 5/2002 | Chen et al. | |
| 6,411,560 B1 | 6/2002 | Tanizaki et al. | |
| 6,441,647 B2 | 8/2002 | Jeon | |
| 6,465,849 B1 * | 10/2002 | Chang et al. | 257/369 |
| 6,521,948 B2 * | 2/2003 | Ebina | 257/347 |
| 6,621,292 B2 | 9/2003 | Sakata et al. | |
| 6,628,551 B2 | 9/2003 | Jain | |
| 6,643,199 B1 | 11/2003 | Tang et al. | |
| 6,674,123 B2 | 1/2004 | Kim | |
| 6,707,708 B1 | 3/2004 | Alvandpour et al. | |
| 6,711,063 B1 | 3/2004 | Dejenfelt et al. | |

(Continued)

OTHER PUBLICATIONS

Vora, M. et al; "A 2 Micron High Performance Bipolar 64K ECL Static RAM Technology With 200 Square Microns Contactless Memory Cell", IEDM Technical Digest 1984, pp. 690-693.

(Continued)

*Primary Examiner*—Tuan T. Lam
(74) *Attorney, Agent, or Firm*—Michael A. Glenn; Glenn Patent Group

(57) ABSTRACT

An apparatus and method for manufacturing metal-oxide semiconductor (MOS) transistors that are operable at voltages below 1.5V, which MOS transistors are area efficient, and where the drive strength and leakage current of the MOS transistors is improved. The invention uses a dynamic threshold voltage control scheme that does not require a change to the existing MOS technology process. The invention provides a technique that controls the threshold voltage of the transistor. In the OFF state, the threshold voltage of the transistor is set high, keeping the transistor leakage to a small value. In the ON state, the threshold voltage is set to a low value, resulting in increased drive strength. The invention is particularly useful in MOS technology for both bulk and silicon on insulator (SOI) CMOS.

12 Claims, 8 Drawing Sheets

U.S. PATENT DOCUMENTS

| | | | |
|---|---|---|---|
| 6,711,088 B2 | 3/2004 | Hayashi et al. | |
| 6,787,850 B1* | 9/2004 | Pelloie | 257/347 |
| 6,940,317 B2* | 9/2005 | Suga | 327/65 |
| 6,958,519 B2* | 10/2005 | Gonzalez et al. | 257/402 |
| 2002/0096723 A1* | 7/2002 | Awaka | 257/360 |
| 2002/0154462 A1* | 10/2002 | Ker et al. | 361/56 |
| 2002/0195623 A1* | 12/2002 | Horiuchi | 257/200 |

OTHER PUBLICATIONS

Takamiya, M. and Hiramoto, T.: "High Performance Electrically Induced Body Dynamic Threshold SOI MOSFET (EIB-DTMOS) with Large Body Effect and Low Threshold Voltage" IEDM Technical Digest 1998.

Diaz, C.H. et al.; "Device Properties in 90nm and beyond and implications on Circuit Design", IEEE 2003.

Rabaey, J. "Issues in Low Power Design—Managing Leakage", Dept of Electrical Engineering and Computer Sciences, Univ. of CA—Berkeley, Aug. 23, 2004.

Bohr, M. High Performance Logic Technology and Reliability Challenges. 2003 IPRS. Apr. 1, 2003.

Fallah, et al. Standby and Active Leakage Current Control and Minimization in CMOS VLSI Circuits. IEICE Trans. on Electronics, Special Section on Low-Power LSO and Low Power IP. vol. E88-C, No. 4, Apr. 2004.

Cao, et al. Reducing Dynamic Power and Leakage Power for Embedded Systems. ASIC-SOC Conference, 2002. 15th Annunal IEEE International vol. Uss. Sep. 2002.

Min, et al. Zigzag Super Cut-Off CMOS (ZSCCMOS) Block Activation with Self-Adaptive Voltage Level Controller: An Alternative to Clock-Gating Scheme in Leakage Dominant Era. Solid-State Circuits Conference 2003. Digest of Technical Papers. ISSCC 2003 IEEE International vol. Iss 2003.

Henzler, et al. Fast Power-Efficient Circuit-Block Switch-Off Scheme. Electronics Letters, vol. 40. Iss 2. Jan. 22, 2004.

Narendra, et al. Full Chip Subthreshold Leakage Power Prediction and Reduction Techniques for sub-0.18um CMOS. Solid-State circuits. IEEE Journal of vol. 39. Iss. 3. Mar. 2004.

Kao, et al. Dual-Threshold Voltage Techniques for Low-Power Digital Circuits. Solid-State Circuits. IEEE Journal. vol. 35. ISs. 7. Jul. 2000.

Kuroda, et al. A 0.9-V, 150MHz, 10-mW, 4mm2,2-D Discrete Cosine Transform Core Processor with Variable Threshold-Voltage (VT) Scheme. Solid-State Circuits. IEEE Journal vol. 31. Iss. 11. Nov. 1996.

Tschanz, et al. Adaptive Body Bias for Reducing Impacts of Die-to-Die and within-die Parameter Variations on Microprocessor Frequency and Leakage. Solid State Circuits Conference. 2002. Digest of Technical Papers. ISSCC. 2002 IEEE International. vol. 1. Iss. Feb. 2002.

von Arnim, et al. Efficiency of Body Biasing in 90-nm CMOS for Low-Power Digital Circuits. Solid State Circuits. IEEE Journal. vol. 40. Iss. 7. Jul. 2005.

Borkar, S. Circuit Techniques for Subthreshold Leakage Avoidance, Control, and Tolerance. IEEE. 2004.

\* cited by examiner

APPARATUS AND METHOD FOR IMPROVING DRIVE-STRENGTH AND LEAKAGE OF DEEP SUBMICRON MOS TRANSISTORS

CROSS REFERENCE TO RELATED APPLICATIONS

This application claims priority to U.S. provisional patent application Ser. No. 60/585,582, filed 7 Jul. 2004, which document is incorporated herein in its entirety by this reference thereto. This application further claims priority to U.S. provisional patent application Ser. No. 60/601,979, filed 17 Aug. 2004, which document is incorporated herein in its entirety by this reference thereto.

BACKGROUND OF THE INVENTION

1. Technical Field

The invention relates generally to MOS transistors. More specifically, the invention relates to the improvement of drive-strength and leakage of deep submicron MOS transistors.

2. Description of the Prior Art

Conventional complementary metal-oxide semiconductor (CMOS) technology currently poses some difficult problems as the minimum feature size shrinks to below 100 nanometers and power supply voltage is reduced to less than 1.0V. A typical layout of a 0.18 micron transistor 100 is shown in FIG. 1. The transistor is manufactured over a well 110 where a diffusion area 120 is created. The gate 130 of the transistor 100 is formed over the well 120 and has a width "w," for example 0.18 micron, as a minimum width for a transistor in a 0.18 micron technology. Contacts 140 and 141 comprise one terminal of the NMOS transistor, for example the drain, and a contact 150 provides another terminal of the transistor 100, for example the source. The contact 131 is connected to the gate 130. There are other minimal feature sizes, such as a minimal size for the well "x" and a minimum distance from the edge of the well to the diffusion area 120 marked as "y." Dimensions such as "w," "x," and "y" are generally process dependent. The power supply voltage is reduced in correspondence with the minimum feature size to maintain a limit on the electrical field across the oxide. Therefore, the power supply voltage has decreased from 3.3V for 0.35-micron CMOS technology to 1.8V for 0.18 micron technology, and is further expected to be at the 1.0V level for 100 nanometers CMOS technology. While power supply voltage decreased, the threshold voltage of the NMOS transistors stayed between 0.45V and 0.35V. The relationship between the NMOS threshold voltage $V_{th}$ and CMOS power supply $V_{DD}$ is known to be very critical. The threshold voltage determines the leakage current, $I_{off}$, of the transistor when it is in its OFF state. As the threshold voltage is driven lower, the leakage current increases.

The drain current of a transistor is a direct function of the overdrive of the transistor, measured as the difference between power supply $V_{DD}$ and threshold voltage $V_{th}$. The drain current of the transistor determines the time required to charge the load capacitance from ground to the level of power supply $V_{DD}$. This overdrive voltage has decreased constantly as the power supply decreased from 3.3V to 1.0V, while threshold voltage decreased only from 0.45V to 0.35V. For 0.1 micron technology, the threshold voltage of the transistors is being scaled below 0.35V at the expense of a very high OFF stage leakage current $I_{OFF}$ which ranges between 10 nA to 100 nA for a transistor with equal gate length and width, or a W/L ratio of 1. For a transistor with a gate width to length (W/L) ratio of 10, the OFF current increases to ten times the value stated above, i.e. from 100 nA to 1000 nA. For a CMOS technology of 0.1-micron minimum feature size, a typical VLSI chip is expected to contain over 100 million gates. Thus, a leakage of every gate of 1 microamperes results in 100 amperes of leakage current.

A scheme to control the threshold voltage dynamically has been proposed by Takamiya et al. in an article titled *High Performance Electrically Induced Body Dynamic Threshold SOI MOSFET (EIB-DTMOS) with Large Body Effect and Low Threshold Voltage*. Takamiya et al. suggest a scheme that shorts the gate and the substrate of the transistors, thereby causing the substrate voltage of the transistor to increase as the gate voltage is increased for a n-channel MOS (NMOS) transistor. This scheme is proposed for NMOS transistors fabricated on silicon-on-insulator (SOI) substrates where the transistor substrate is totally isolated. This scheme manipulates the threshold voltage by changing the bias of the substrate in the positive direction for a NMOS transistor along with a positive signal at the gate. As the substrate to source voltage becomes positive, the depletion layer width is reduced. This results in a lower threshold voltage of the transistor, thereby increasing the current from the transistor. In the native form, the Takamiya et al. invention is applicable only for circuits using power supply voltage of less than 0.6V because this scheme turns on the substrate-to-source diode. The leakage from this diode must be limited. Otherwise, one type of leakage would be traded for another, i.e. from drain-to-source leakage to substrate-to-source leakage.

Douseki in U.S. Pat. No. 5,821,769 describes a method for the control of the threshold voltage of a MOS transistor by connecting a MOS transistor between the gate and the substrate to control the threshold voltage. The Douseki invention requires the addition of another transistor for every transistor whose threshold voltage is dynamically controlled. The adjusted threshold voltage is fixed by the power supply voltage and the threshold voltage of the additional transistor. The area penalty is fairly large for the Douseki invention, although it can be executed without additional process steps.

There is a therefore a need in the art for a technology which can reduce the leakage of MOS transistors without adversely affecting the drive current or the drain current under saturation conditions, which conditions are stated as drain-source voltage and gate-source voltage equal to the power supply voltage ($V_{DS}=V_{GS}=V_{DD}$).

SUMMARY OF THE INVENTION

An apparatus and method for manufacturing metal-oxide semiconductor (MOS) transistors that are operable at voltages below 1.5V, which MOS transistors are area efficient, and where the drive strength and leakage current of the MOS transistors is improved. The invention uses a dynamic threshold voltage control scheme that does not change the existing MOS technology process. The invention provides a technique that controls the threshold voltage of the transistor. In the OFF state, the threshold voltage of the transistor is set over 0.45V, keeping the transistor leakage to less than 0.1 nA/micron width. In the ON state, the threshold voltage is set to less than 0.25V, resulting in increased drive strength. The invention is particularly useful in MOS technology for both bulk and silicon on insulator (SOI) CMOS.

DETAILED DESCRIPTION OF THE INVENTION

The core of the disclosed invention is the addition of a circuit to the NMOS transistor that results in the increase of the drive current while in an ON state, and a reduction of the leakage current while in the OFF state. Specifically, this is achieved by implementing a control circuit between the gate and the substrate of the transistor. The control circuit can be as simple as a resistance, or it can include one or more diodes. Specifically, the circuit forces a high threshold voltage $V_{TH}$ in the OFF state of the NMOS transistor and a low $V_{TH}$ in the ON state of the NMOS transistor. A detailed description of the disclosed invention follows.

Figure 1:
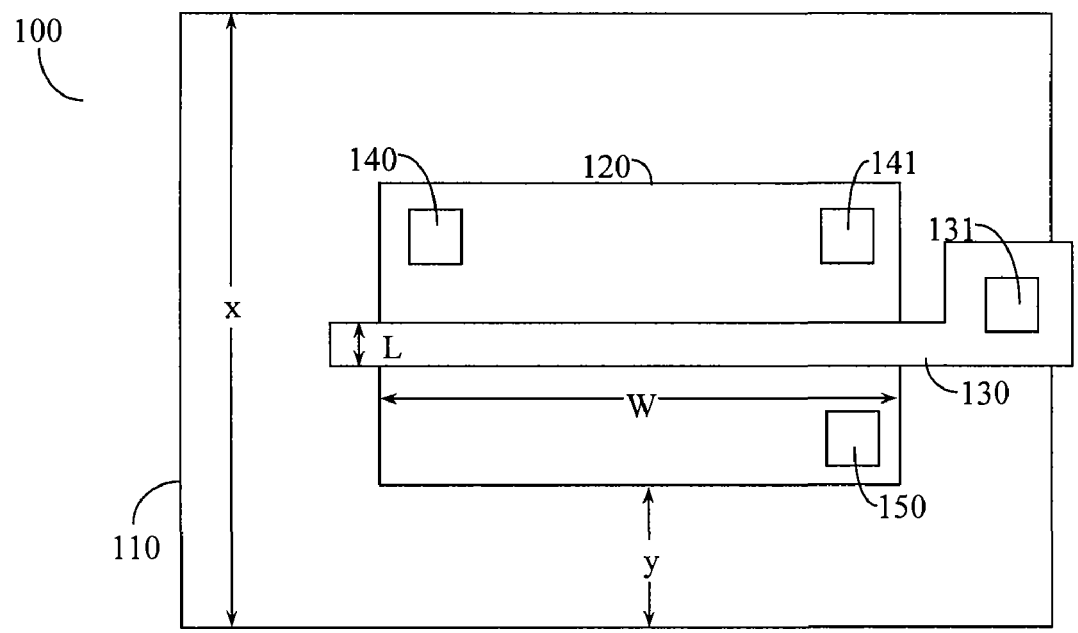
FIG. 1 shows a typical layout of a 0.18 micron transistor.
Figure 2:
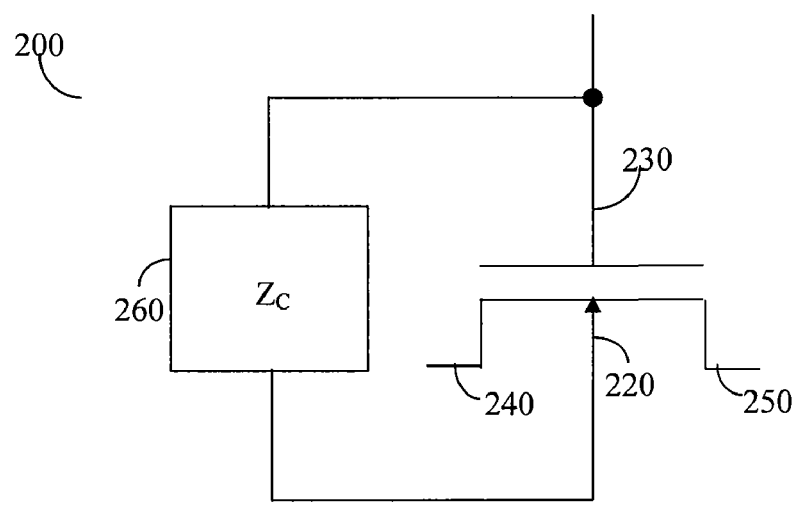
FIG. 2 is a schematic diagram of a control circuit $Z_C$ connected between the gate and substrate terminals of a NMOS transistor in accordance with the disclosed invention.

FIG. 2 is an exemplary and non-limiting schematic diagram of a circuit 200 in accordance with the disclosed invention. A control circuit $Z_C$ 260 is connected to a NMOS transistor comprising a substrate 220, a gate 230, a drain 240, and a source 250. The control circuit is connected between the gate 230 and the substrate 220. In accordance with the disclosed invention, the control circuit $Z_C$ implements a dynamic voltage control by using, for example, various types of diodes to control substrate voltage. By controlling the threshold voltages to be different in the ON and OFF states of the controlled NMOS transistor, improvement in drive current in the ON state and leakage current in the OFF state is achieved. Furthermore, there is provided an extremely area efficient implementation of dynamic threshold voltage control, as described in further detail below. The threshold voltage is modulated by changing the net charge in the depletion layer beneath the gate. This is commonly known as "body effect," and its strength, that is, the change in threshold voltage associated with a change in the effective substrate voltage, is increased by higher values of substrate doping in the region immediately beneath the gate.

Figure 3:
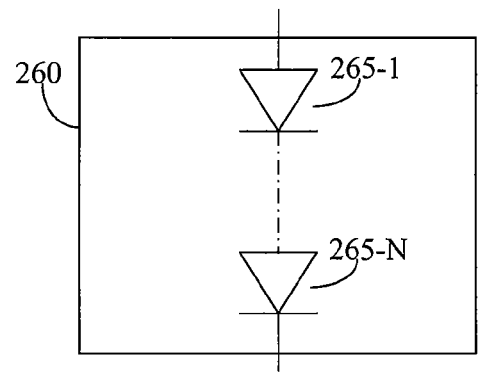
FIG. 3 is a schematic diagram of the control circuit $Z_C$ of FIG. 2.

FIG. 3 shows an exemplary control circuit 260 comprised of a plurality of diodes 265. The control circuit 260 may comprise of one or more diodes connected between the gate 230 and the substrate 220 of the NMOS transistor. The dynamically adjusted threshold voltage is varied by adjusting the diode layout geometry. No variations in the manufacturing process are required, however, in one embodiment of the invention, discussed in more detail below, such variations are shown, and provide additional benefits to the disclosed invention.

The diodes are fabricated in a variety of techniques as detailed further. One such type is that of diffused diodes. These diodes are conventional diodes that are fabricated by diffusing n-type and p-type layers in an isolated structure. The voltage across the diodes is controlled by adjusting the doping profiles in silicon and programming the area, thereby controlling the voltage drop across the diode.

Figure 4A:
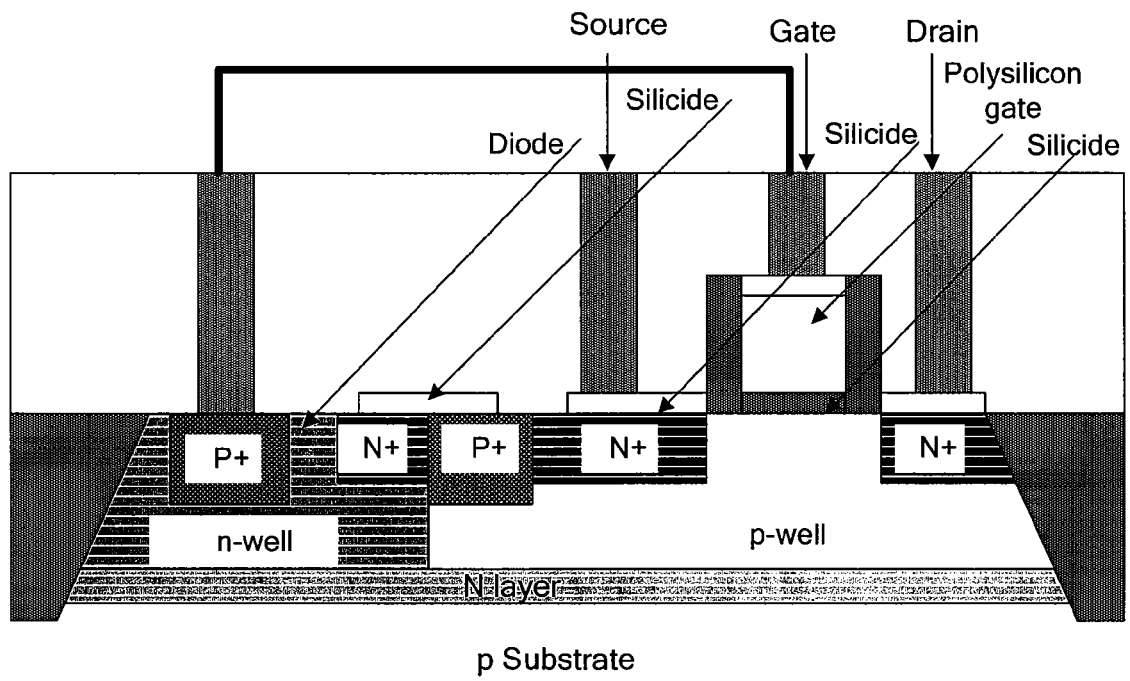
FIG. 4A is a cross-section of a NMOS transistor having a diffused diode control circuit $Z_C$.
Figure 4B:
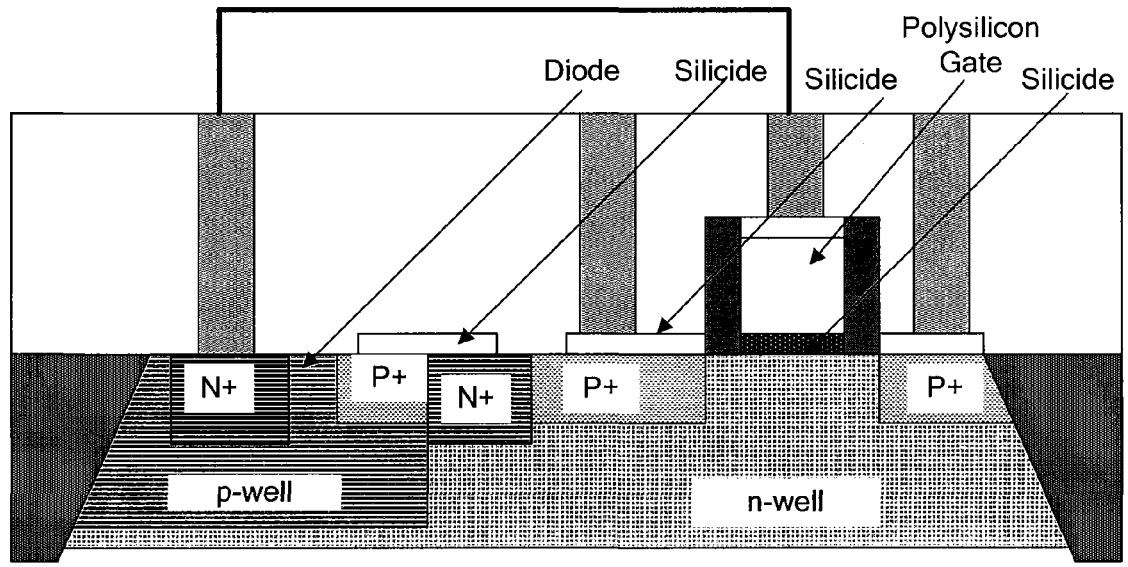
FIG. 4B is a cross-section of a PMOS transistor having a diffused diode control circuit $Z_C$.

FIGS. 4A and 4B show exemplary and non-limiting cross sections of a circuit 200 using such diffused diodes. The diffused diodes are conventional diodes that are used to adjust the bias voltage at the well. The diodes are formed differently for NMOS and PMOS transistors. The NMOS transistors are formed in a region isolated from the p-type substrate by a deep N type implant. This isolation is achieved by existing triple well CMOS technology, as is known to those skilled in the art. This isolation can also be achieved by a deep N type implant in the region of NMOS transistors consisting of phosphorous with an implant dose ranging from $1 \times 10^{11}/cm^2$ to $1 \times 10^{14}/cm^2$ and an energy ranging from 50 KeV to 5 MeV. This implant is annealed at temperatures ranging from 900° C. to 1150° C. for 15 seconds to 2 hours. In one embodiment of the invention, the diodes for use with NMOS structures are formed in an area adjoining the NMOS, next to the well tap in the same isolation area or another suitable location. The area containing the diode additionally receives the n-well implant to form the cathode. One exemplary but non-limiting implementation of the invention uses the process step which is used to form the n-well region for PMOS transistors. This is done by using, for example, phosphorous or arsenic ions with doping in the range of $1E11/cm^2$ and $5E14/cm^2$ at an implant energy in the range of 25 KeV and 400 KeV. The N type isolation implant and the N-well implant form a contiguous N type semiconductor region. An n+ contact region is formed in the implanted n-well region near the surface to provide the Ohmic contact for the cathode. The anode region is formed by the p+ implant that is used for making the p+ source/drain regions for the PMOS transistor. The anode and cathode regions are formed using the source and drain implants for PMOS and NMOS, respectively. The implant dose and energy are determined by the electrical characteristics of the transistor. This diode can be connected to the well contact with standard metallization, or to save space, a silicide strap formed by in-situ, self-aligned silicidation of silicon by reacting it with titanium, cobalt, nickel, or any other suitable metal may be provided to short the cathode of the diode with the well contact of the NMOS.

In a PMOS implementation shown in FIG. 4B, the transistor itself is isolated by the virtue of being formed in the N-well and no additional steps are needed to form the isolation region for the transistor and the diode from the substrate. In an exemplary embodiment, the anode region of the diode is formed by the anti-punch through boron implant used for NMOS transistors or another suitable implant step. To insure a contiguous P type region for the diode in the N-well, an additional p-type implant using boron or indium with dose in the range of 1E12 to $1E15/cm^2$ and implant energy in the range of 5 KeV to 200 KeV may be used to form the anode region of this diode. The Ohmic contact to the anode region is formed by the source/drain implant for the PMOS transistor. The cathode region of the diode is formed by the n+ implant, which is the same implant as the source/drain implant for the NMOS transistor. A silicide strap formed by in-situ self aligned silicidation of silicon by reacting it with titanium, cobalt, nickel, or any other suitable metal is provided to short the anode of the diode with the well contact of the PMOS.

Another type of diode is that of integrated polysilicon diodes. These diodes are formed by the contact of n-type and p-type polysilicon to underlying silicon of opposite polarity. The polysilicon layers are the same as those that are used to build the gate of the MOS transistors. These diodes are formed by preventing the formation of the gate oxide underneath the transistor gates or by removing the oxide prior to the deposition of polysilicon. The voltage across the diodes is adjusted by controlling the doping profiles in silicon and programming the area of the diodes.

Figure 4C:
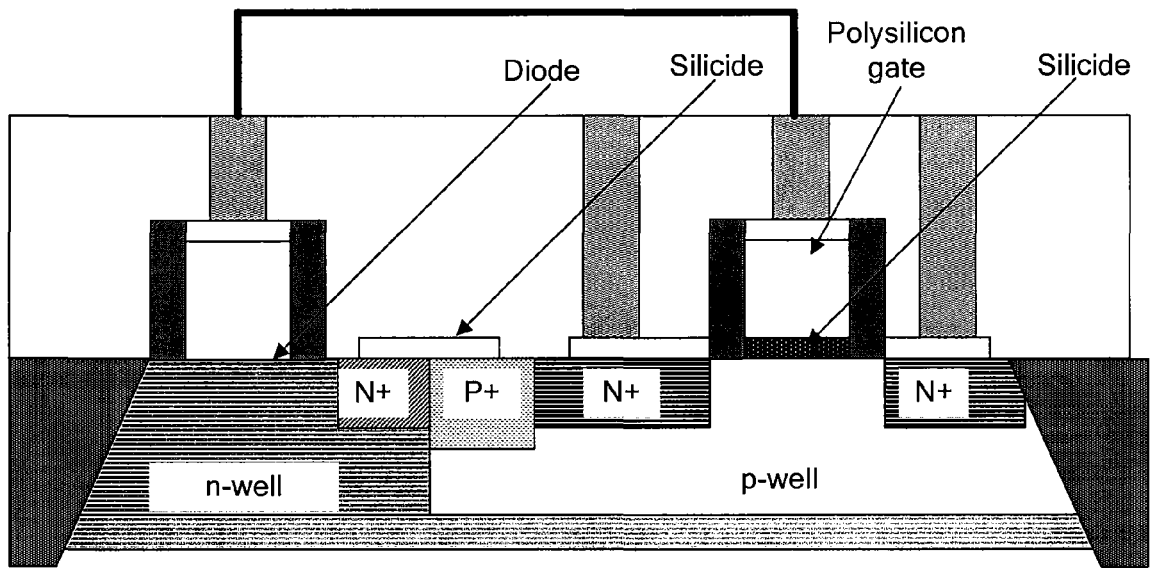
FIG. 4C is a cross-section of a NMOS transistor having a self-aligned diode control circuit $Z_C$.

FIG. 4C shows an exemplary and non-limiting cross section of a circuit 200 using a self-aligned diode control circuit $Z_C$. The diodes are formed by depositing polysilicon on top of the regions where gate oxide has been prevented from growing during the thermal oxidation cycle, or where it has been removed prior to the deposition of polysilicon by an appropriate process step. The wafers are processed through a typical CMOS process by implanting well regions and forming the isolation oxide by any of the established processes. An additional process step is performed to form the isolation region where NMOS transistors are to be formed, and is carried out as described in the previous paragraph. Next, the threshold adjust implants are made. The growth of silicon dioxide on selected areas is accomplished by selectively implanting the area of silicon where the oxide is to be prevented from growth with a photoresist mask covering the rest of the wafer. This is achieved by implanting this region with nitrogen atoms by ion implantation to a dose of $1E14/cm^2$ to $1E16/cm^2$ at an implant energy of 2 KeV to 50 KeV. The wafers are then taken through the gate oxidation cycle, as may be required by the process, to achieve the appropriate electrical characteristics of the transistor. Thus, oxidation of the implanted regions is prevented while the oxidation of silicon region on the remaining wafer takes place. Alternately, the gate oxide is etched selectively using a mask from the region where the oxide has to be removed. A layer of polysilicon is deposited next on the wafer and the regular CMOS process steps are conducted. The polysilicon layer is doped to form conductivity region n+ and p+ for NMOS and PMOS transistor gates, respectively. An Ohmic electrical connection between the diode terminal and the well terminal is accomplished with the help of the self-aligned silicide, which is an essential part of the CMOS process step.

In an alternate embodiment of the invention, the gate oxide underneath the polysilicon on top of the diode region is damaged by the appropriate dopant type to change the electrical characteristic of the oxide to allow it to conduct electrical charge. For the NMOS transistors, a phosphorous or arsenic implant and for PMOS transistors, a boron implant of dose $1 \times 10^{13}$ to $1 \times 10^{16}$ atoms/cm$^2$ with an energy ranging from 25 KeV to 200 KeV is used to implant the polysilicon layer and damage the underlying gate oxide in the region of the diode to form an electrically conducting electrode. In another embodiment of the invention, an inert atom such as argon is used to damage the gate oxide, using implant energy and dose deemed essential to cause irreparable damage to the gate oxide layer.

Yet another type of diode is the in-line polysilicon diode. These are the most area and process efficient structures created by implanting n-type and p-type dopant separated laterally in a line of polysilicon. The voltage drop across the diodes is controlled by programming the location of the n-type and p-type implants and their doses used to form the diodes.

Figure 4D:
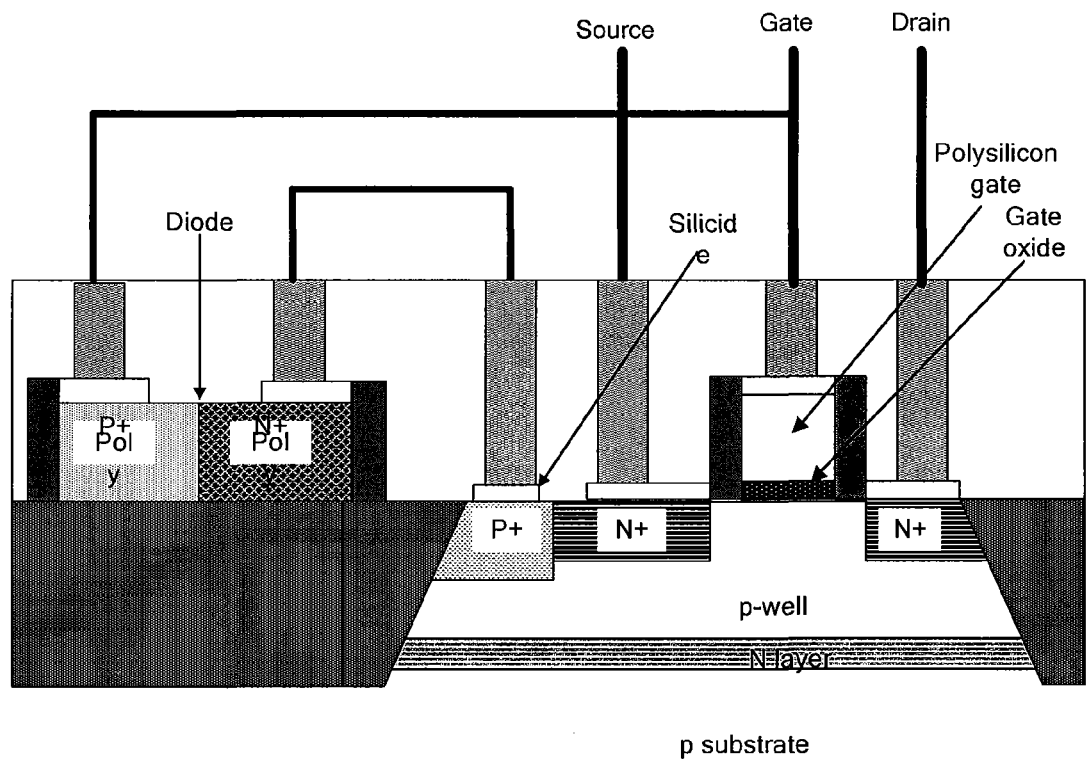
FIG. 4D is a cross-section of a NMOS transistor having a poly diode control circuit $Z_C$.

FIG. 4D is an exemplary and non-limiting cross section of a circuit 200 using a poly diode control circuit $Z_C$. In one embodiment of the invention, a lateral diode is formed in a line of polysilicon between n+ and p+ polysilicon regions, where the electrical characteristics of the polysilicon diode are controlled by the lateral isolation between the n+ and p+ regions in polysilicon. The p+ and the n+ regions of polysilicon are formed by the source/drain implants of the NMOS and PMOS transistors. The polysilicon is doped, for example, with phosphorous, arsenic, or antimony to a dose in the range of $5 \times 10^{14}$ to $5 \times 10^{16}/cm^2$ at an energy in the range of 5 KeV to 200 KeV. The p+ region is formed by doping polysilicon with boron or indium to a dose in the range of $1 \times 10^{14}$ to $5 \times 10^{16}/cm^2$ at an energy in the range of 5 KeV to 200 KeV. The thickness of the polysilicon layer is determined by the transistor electrical characteristics. For 0.13 micron to 0.07 micron drawn dimensions, the thickness of the polysilicon layer is in the range of 1000 angstroms to 4000 angstroms. The space between the n+ and p+ implant regions is between −0.5 micron (overlap) to +2.0 micron (separation) and it is programmed during mask layout. The lateral-masking dimension controls the barrier height of polysilicon diode. The layer of polysilicon is implanted with n+ and p+ on two sides having a lateral separation. A diode is formed at the intersection of the two regions. The forward characteristics of this diode are dependent upon the level of doping of the two impurity types in polysilicon and the separation between the two regions. Coincident mask layers (ls=0) or overlapping mask layers (negative ls) produce diodes having very high reverse leakage and low forward drop. On the other hand, with increasing separation of the n+ and p+ regions, the reverse leakage of the diode decreases and the forward drop across the diode increases.

Alternately, polysilicon layer is uniformly implanted in the region of the diode by an N-type (P-type) dopant, as the case may be, with a lower implant dose, such as $1 \times 10^{13}$–$5 \times 10^{15}$ atoms/cm$^2$ of appropriate doping species, and the desired region for the formation of anode (cathode) is implanted with a heavier dose of the P (N) type species with the dose of $2 \times 10^{13}/cm^2$–$5 \times 10^{16}$ atoms/cm$^2$. This arrangement does not require alignment of the N and P type implants and relies strictly on the dopant concentration to determine the diode characteristics.

The isolation of the NMOS transistor obtained by this technique leaves the N type layer underneath the NMOS transistor floating or not in Ohmic contact with any node with a well-defined voltage. This configuration is used in the invention where the maximum voltage on the drain of the NMOS transistor is $V_{DD}$ ($\leq 1.5V$) that is less than two times the breakdown voltage of the p-n junction. One appropriate application of the invention is for systems using $V_{DD}$ at or below 1.0V, where the possibility of any parasitic action due to incidental forward biasing of any p-n junction is negligible. However, to safeguard against forward biasing of any parasitic p-n junction, an alternate embodiment of the invention includes the formation of a deep Ohmic contact extending from the drain of the NMOS transistor and connecting with the isolation N-layer underneath the NMOS. This N-type tap is formed by a multiplicity of deep ion implants of phosphorous or arsenic atoms in selected areas of the drain, such that the transistor characteristics are not adversely impacted. The exact ion implant dose and energy of this N-tap is dependant upon the device structure, and is expected to be in the range of $1\times10^{11}/cm^2$ to $1\times10^{14}/cm^2$ and energy between 5 KeV and 2 MeV. LDD implants, which are common in high performance CMOS technology, may be used advantageously to provide the lower doping density required by the polysilicon diode.

In yet another embodiment of the disclosed invention use is made of Schottky diodes. The Schottky diodes are formed at the interface of a layer of a metallic material, for example, titanium nitride, and n-type or p-type silicon. The Schottky diodes can be formed on n-type and p-type silicon by carefully selecting the work function of the metallic layer and adjusting the Fermi level of the silicon by control of doping. The voltage across the diodes can be adjusted by changing the doping in the well and the diode area.

Figure 4E:
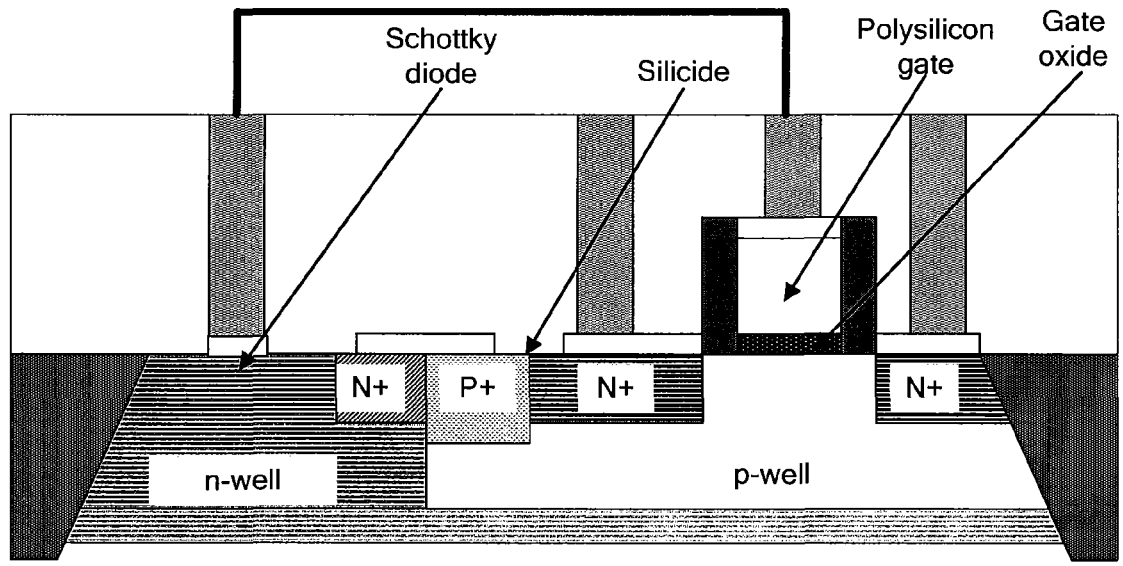
FIG. 4E is a cross-section of a NMOS transistor having a Schottky diode control circuit $Z_C$.

FIG. 4E shows an exemplary and non-limiting cross section of a circuit 200 using a Schottky diode control circuit $Z_C$. Taking advantage of the suitable band gap of, for example, TiN as the contact metal, Schottky diodes can be formed on both the n-type and p-type silicon with light doping (less than $1\times10^{17}/cm^3$). Thus, a Schottky diode for NMOS is formed by making, for example, a TiN to n-type diode in the n-well region. A Schottky diode to work with PMOS is formed in the p-well region adjoining the PMOS transistor.

In one embodiment of the disclosed invention, the well biasing scheme is used only for PMOS transistors that are built in a CMOS technology. The PMOS transistors are isolated as they are formed in the n-well regions, while NMOS transistors are formed in the p-well regions that are electrically connected to one another because they are formed over p-type silicon substrate as the starting substrate material.

To control the substrate voltage, one or more diode types can be used in a design by connecting them in series or parallel to obtain the appropriate voltage at the substrate, with appropriate temperature coefficient. Also, the threshold voltage control can be applied to either or NMOS or PMOS transistor, or to both transistors with appropriate diode types. The invention covers the three cases, namely dynamic control of threshold voltage for NMOS only, for PMOS only, or that of both NMOS and PMOS.

For the purpose of explanation, it is now assumed that the operating voltage $V_{DD}$ is 1.0V for a CMOS circuit. A CMOS buffer uses the NMOS transistor with the source-substrate diode area of Asn and the current-voltage characteristics are as follows:

$$V_f = V_t * \ln(I_{diode}/I_{sn0})$$

Where $V_t$ is the thermal voltage, $I_{diode}$ is the current passing through the well-substrate diode, and $I_{sn0}$ is the well-substrate diode saturation current.

An external diode $D_{ex}$ is used as a control device $Z_C$ 260. The voltage across the external diode is given by $$V_{f\_ex} = V_t * \ln(I_{diode}/I_{ex0})$$

Where $I_{ex0}$ is the diode saturation current of the external diode. Because the two diodes are in series, the same current flows through the diodes. The sum of the voltages across the two devices is equal to $$V_{DD}, V_{DD} = V_f + V_{f\_ex} = V_t * \ln(I_{diode}/I_{ex0}) + V_t * \ln(I_{diode}/I_{ex0})$$

Because $I_{sno}$ is fixed by the NMOS transistor characteristics, the voltage across the external diode is varied by changing diode saturation current $I_{ex0}$ which is a product of the current density and the area. If the voltage drop across the two diodes is exactly equal, then the substrate voltage of the NMOS transistor is at 0.5V when the gate is at 1.0V. Reducing $I_{ex0}$ results in decreased voltage drop $V_f$ across the source-substrate diode and hence, threshold voltage of the NMOS transistor.

Figure 5:
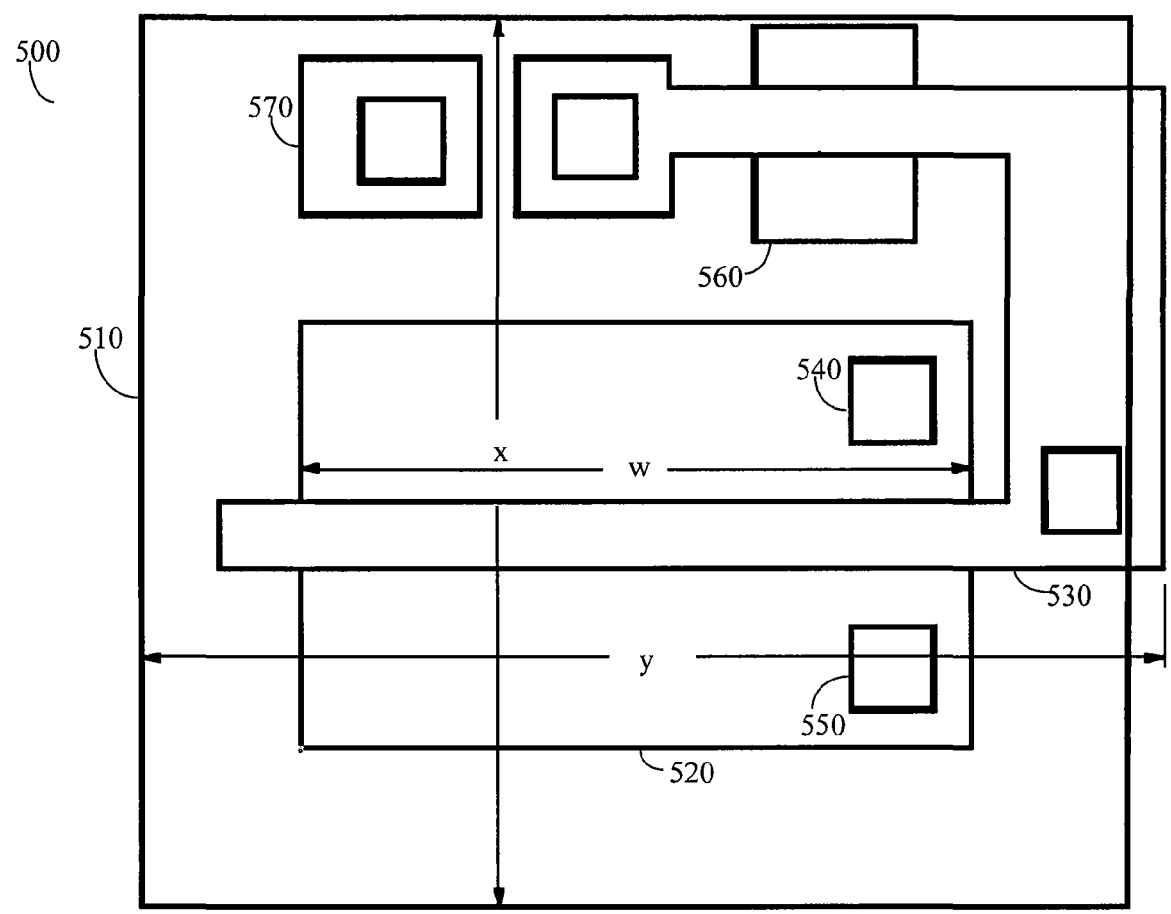
FIG. 5 shows an exemplary layout of a MOS transistor having a control circuit $Z_C$.

FIG. 5 shows an exemplary and non-limiting layout 500 of a layout of a MOS transistor with a control circuit $Z_C$. The MOS transistor is formed over a substrate 510, and further of a well 520, for example an n-well, over which a gate 530 is deposited having an insulating layer in between the well 520 and the gate 530. Contacts 540 and 550 are connected, for example, to the drain and source of the MOS transistor, and a contact 535 to the gate 530. Furthermore, a diode 560 is formed which may be connected to the substrate 570 by means of a metal path.

For a power supply voltage of 1.0V, the control circuit 260 comprises a single diode. The diode should sustain a forward drop of between 0.5V to 0.6V when connected in series with the substrate-to-source diode. The resulting voltage drop across the substrate-to-source diode is 0.5 to 0.4V. In one embodiment of the disclosed invention, the control circuit 260 is formed from a diffused diode. In another embodiment of the disclosed invention, the diode is formed from a single polysilicon diode or two polysilicon diodes connected in parallel. For a power supply voltage of 0.9V, the bias control circuit 260 provides a forward drop of no more than 0.4V across the substrate-to-source diode.

For a 1.2V power supply the resulting forward bias voltage on the substrate-to-source diode is 1.2V. The control circuit $Z_C$ 260 is comprised of a single poly-diode having a large voltage drop. The doping across the poly diode is controlled such that when the voltage at the gate terminal turns high, for example to 1.2V, the voltage drop across the polysilicon diode is nearly 0.7V and the drop across the source-substrate diode is 0.5V. This limits the leakage across the diode to less than 10 nano-amperes per micron width, i.e. nearly a ten-fold reduction in leakage. With the source-to-substrate bias at −0.5V, the threshold voltage drops nearly 250 mV, resulting in an increase in the drain current of nearly 10–20% as compared to static threshold voltage.

In another embodiment of the disclosed invention, the benefits of the invention are accomplished by using a polysilicon diode in series with a Schottky diode formed by making TiN to n-type or p-type silicon.

In the case of a power supply of 1.5V, the NMOS and PMOS transistors have a threshold voltage of 0.45V, with an upper limit of 0.7V and a lower limit of 0.3V. These numbers refer to the magnitude of the voltage only because the threshold voltage of the PMOS devices is a negative quantity. The configuration of the control circuit $Z_C$ 260 depends upon the operating voltage. For a power supply voltage of 1.5V, the configuration of the control circuit $Z_C$ 260 is accomplished by using two diodes in series. The two diodes are made in polysilicon by doping the polysilicon with n+ and p+ implant and the using silicide to connect the gate of the NMOS transistor to the anode, or for a PMOS transistor to the cathode, of the first diode. Similarly, the cathode of the first diode is connected to the anode of the second diode with silicide. Because silicide is formed on the polysilicon layer in a self-aligned manner, it does not require any contact hole or metal to be formed on the transistor. The diodes can also be formed on a silicon substrate. Furthermore, a combination of diodes formed on polysilicon and silicon substrates can be used. In an implementation of disclosed invention in SOI technology, the diode is formed on isolated islands insulated by oxide or by a set of polysilicon diodes, as described above.

Figure 6:
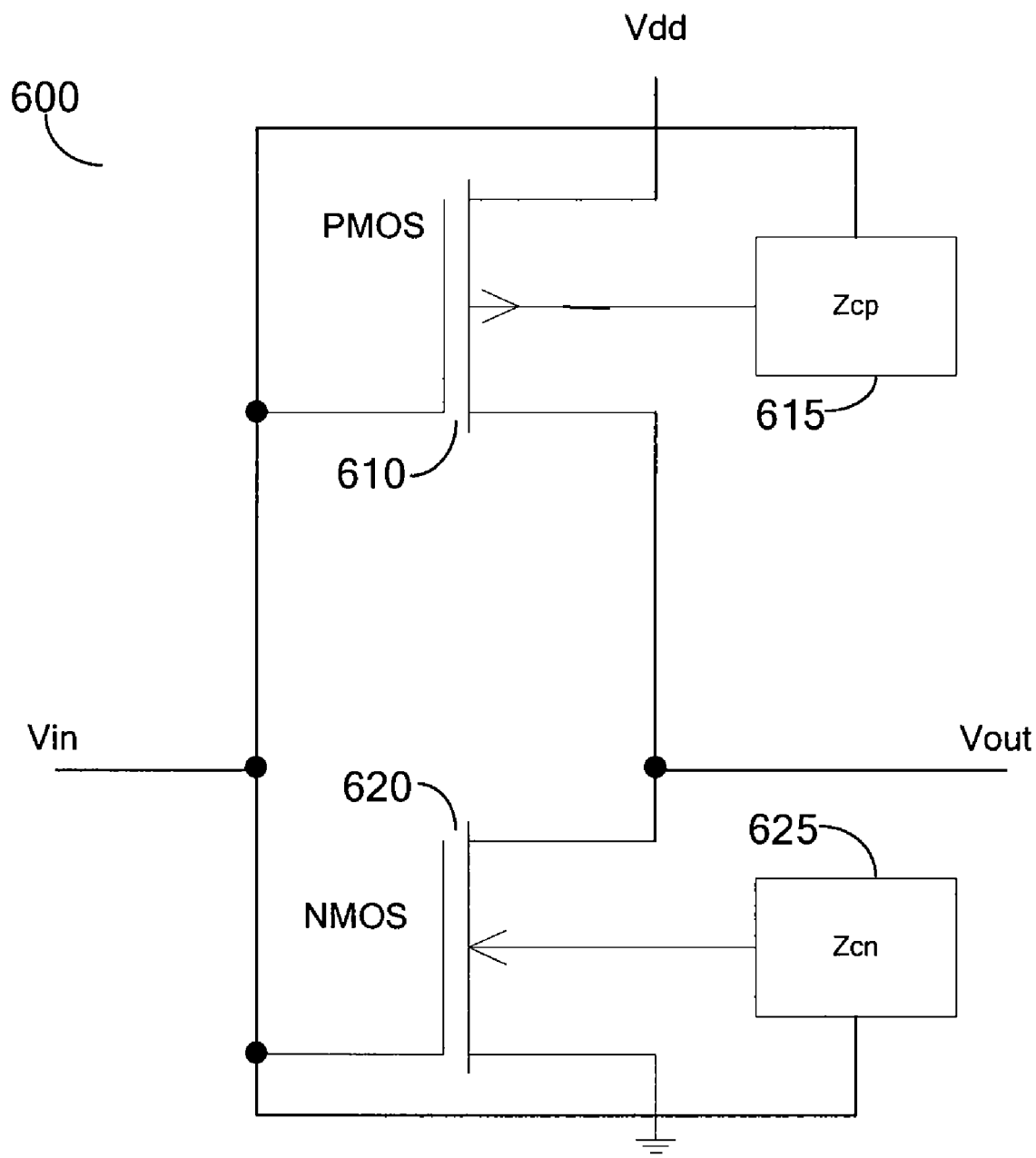
FIG. 6 shows an exemplary implementation of the invention in a CMOS buffer.

FIG. 6 is an exemplary and non-limiting schematic 600 of a CMOS buffer that is formed using the disclosed invention. Control circuits $Z_{C_n}$ 625 and $Z_{C_p}$ 615 are the active devices for controlling the threshold voltage of an NMOS transistor 620 and a PMOS transistor 610, respectively. The control circuits 615 and 625 are implemented in accordance with the disclosed invention.

Figure 7:
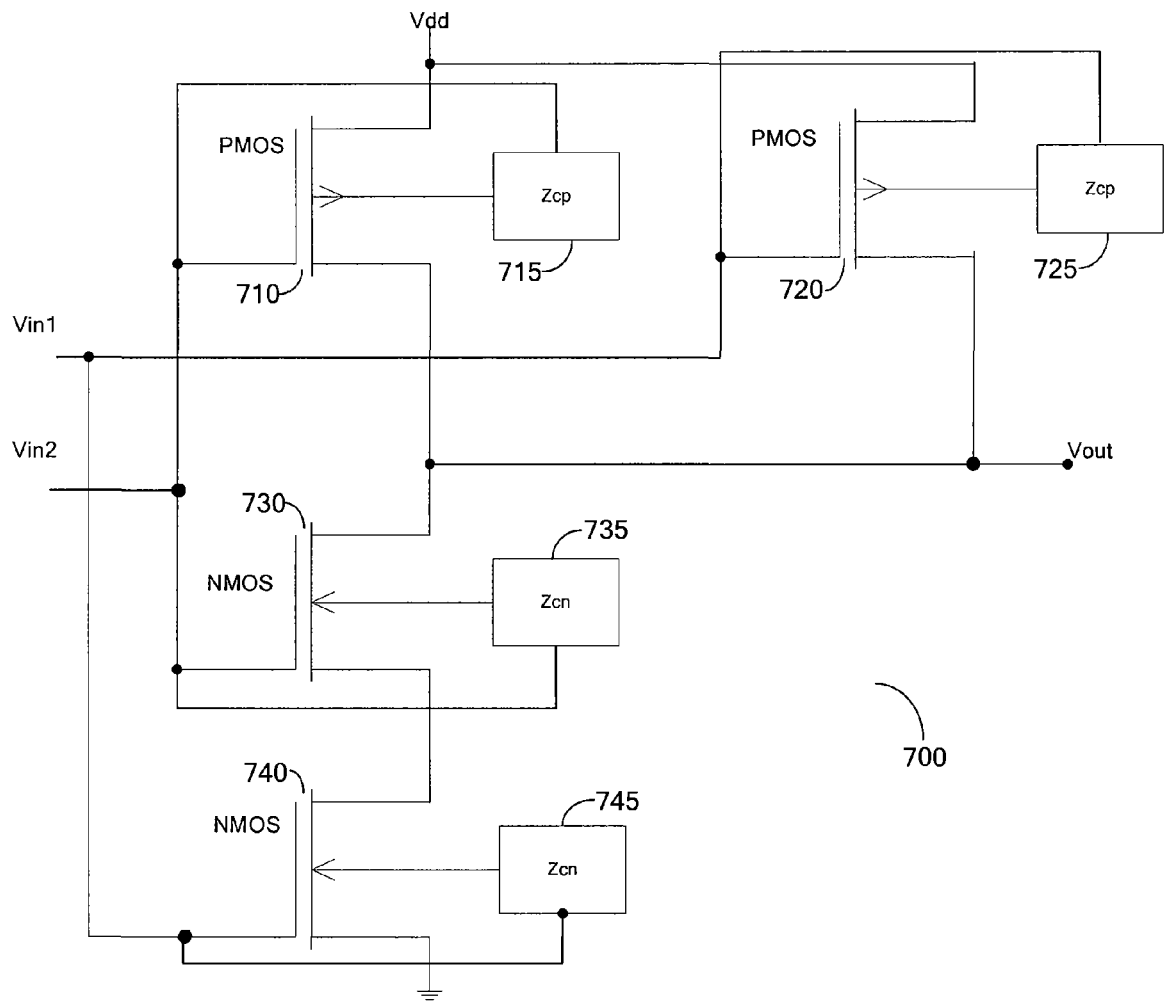
FIG. 7 shows an exemplary implementation of the invention in a CMOS NAND gate.

FIG. 7 shows an exemplary and non-limiting schematic 700 of a CMOS NAND gate that is formed using the disclosed invention. The two inputs to the NAND gate are $V_{in1}$ and $V_{in2}$, and $V_{out}$ shows the output of the circuit 700. The active circuits for controlling the threshold voltages of the NMOS transistors 730 and 740 are the control circuits $Z_{C_n}$ 735 and $Z_{C_n}$ 745, respectively. The active circuits for controlling the threshold voltages of PMOS transistors 710 and 720 are $Z_{C_p}$ 715 and $Z_{C_p}$ 725, respectively. The control circuit 715, 725, 735, and 745 may further be customized for different transistors, as may be required by specific circuit configurations. The control circuits 715, 725, 735, and 745 are implemented in accordance with the disclosed invention.

Figure 8:
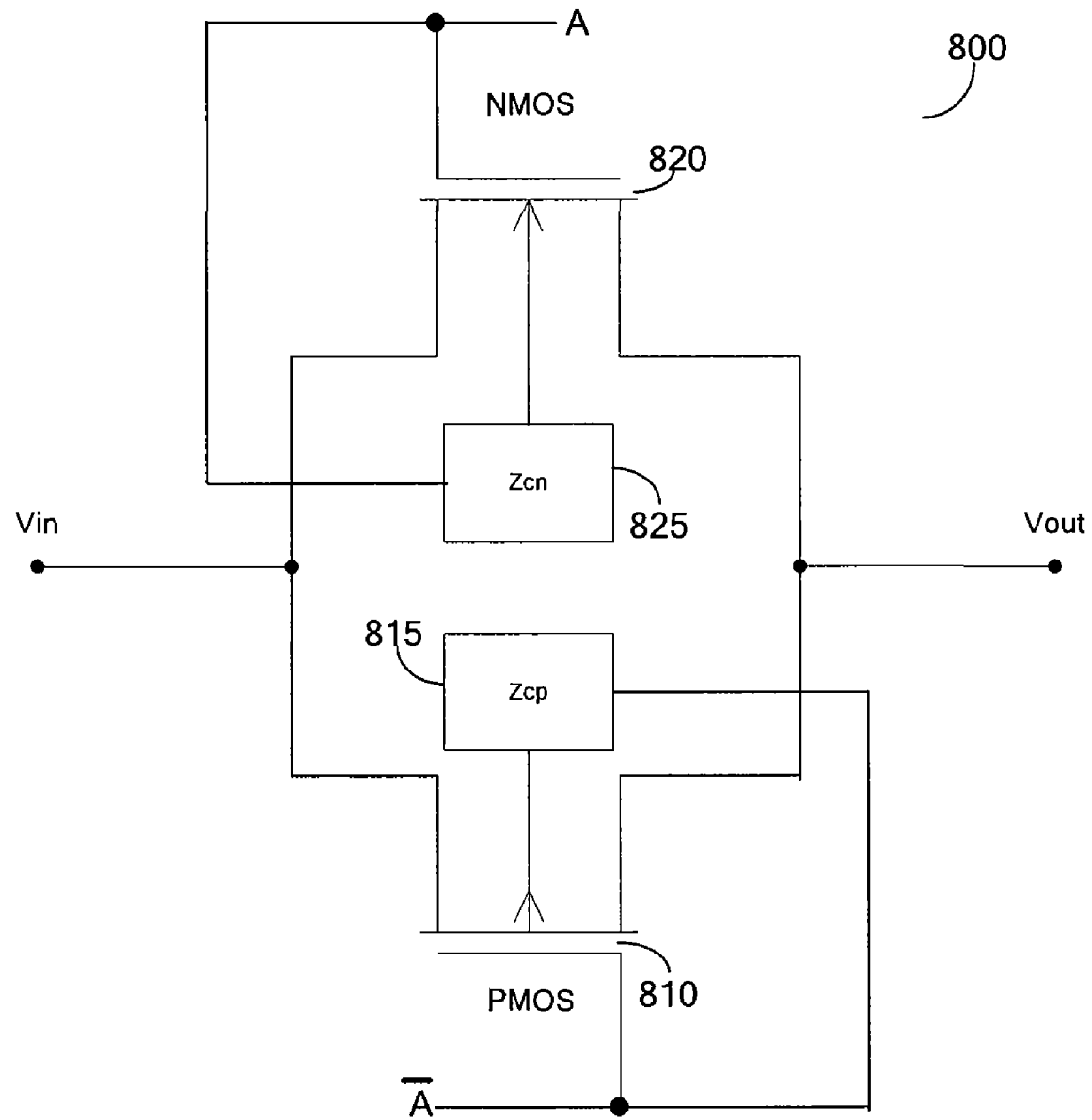
FIG. 8 shows an exemplary implementation of the invention in a CMOS pass gate.

FIG. 8 is an exemplary and non-limiting schematic 800 of a CMOS pass gate with a signal A controlling the status of the pass gate. The threshold levels of the NMOS transistor 820 are controlled by the control circuit $Z_{C_n}$ 825. The threshold levels of the PMOS transistor 810 are controlled by the control circuit $Z_{C_n}$ 815. The pass gate may also comprise only an NMOS transistor, for example the NMOS transistor 820, or only a PMOS transistor, for example the PMOS transistor 810, with the corresponding active threshold control device, as deemed appropriate for the specific application. The control circuits 815 and 825 are implemented in accordance with the disclosed invention.

A person skilled in the art would note that while the description provided herein is for VDD voltages below 1.5V, the same apparatus and method can be implemented with appropriate modifications to VDD voltages higher than that. Furthermore, the descriptions herein are provided as mere examples of the disclosed invention and by no means should be viewed as limiting the scope of the disclosed invention. While NMOS implementations are shown herein, the invention can be equally used for PMOS transistors. The use of a control circuit, such as a diode, connected between the gate and the substrate, as described herein, may be further useful in conjunction with memory designs, and particularly with such memories that have significant leakages, such as random access memories (RAMs) and dynamic RAMs (DRAMs). Moreover, it is noticed that typically, in a representative deep submicron CMOS process using 0.1 micron lithography, the change in leakage current from 0V substrate bias to −1V substrate bias for a PMOS transistor is much higher (nearly a factor of 10), while the leakage current change from 0V to −1V substrate bias for an NMOS transistor is lower (a factor of 3–3.5). This is due to the fact that the well region of the PMOS transistor is highly doped to counter dope against the diffusion of P+ source and drain. By contrast, the N+ source and drain region of an NMOS transistor are well controlled and, hence, the substrate doping is kept low, which leads to minimal change in leakage with substrate bias. Hence, a process change which increases the substrate doping causes the amplification of the effect of the substrate voltage manipulation. This is also supported by the basic principles of MOS device physics which dictate that the impact of substrate bias on threshold voltage is enhanced with increasing substrate doping. Notably, this also results in an increase in the capacitance of the source and drain region, however, it has a minimal impact upon the circuit speed because the load capacitance in deep submicron CMOS VLSI circuits consists mainly of interconnect capacitance. Therefore, the use of a more highly doped substrate or well region, results in the increase in drain current by forward biasing. Alternately, for the same drain current, the leakage current is decreased. The device characteristics can also be optimized to increase the bulk doping level as well as the gate oxide thickness, so that drain leakage and gate tunneling current is decreased simultaneously.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

The invention claimed is:

1. A method for reducing leakage current and increasing drive current in a metal-oxide semiconductor (MOS) transistor having a source terminal, a drain terminal, a gate terminal, and a substrate terminal, said method comprising the step of:
   forming at least one diode between said gate and said substrate of said MOS transistor;
   wherein said MOS transistor comprises any of an n-channel device and a p-channel device
   said step of forming at least one diode comprising the steps of:
   forming at least one diffused diode by diffusing n-type and p-type layers in an isolated structure; and
   adjusting doping profiles in silicon and programming diode area to control voltage drop across said diode.

2. The method of claim 1, further comprising the step of:
   forming NMOS transistors are formed in a region isolated from a p-type substrate by a deep N type implant.

3. The method of claim 2, wherein said isolation is achieved by any of:
   triple well CMOS technology; and
   a deep N type implant in a region of NMOS transistors consisting of phosphorous with an implant dose ranging from $1 \times 10^{11}/cm^2$ to $1 \times 10^{14}/cm^2$ and an energy ranging from 50 KeV to 2 MeV, wherein said implant is annealed at temperatures ranging from 900° C. to 1150° C. for 15 seconds to 2 hours.

4. The method of claim 2, further comprising the steps of:
   forming diodes for use with NMOS structures in an area adjoining NMOS, next to a well tap in a same isolation area;
   providing an n-well implant in an area containing said diode to form an n-well region for PMOS transistors by using phosphorous or arsenic ions with doping in the range of $1E11/cm^2$ and $5E14/cm^2$ at an implant energy in the range of 25 KeV and 400 KeV;
   using an N type isolation implant and an N-well implant to form a contiguous N type semiconductor region;
   forming an n+ contact region in said implanted n-well region to provide Ohmic contact for a cathode;
   forming an anode region by a p+ implant that is used for making p+ source/drain regions for a PMOS transistor;
   forming said anode and cathode regions using source and drain implants for PMOS and NMOS, respectively;
   determining implant dose and energy by electrical characteristics of said transistor; and
   forming a silicide strap by in-situ, self-aligned silicidation of silicon by reacting it with titanium, cobalt, nickel, or any other suitable metal to short a cathode of said diode with a well contact of said NMOS.

5. The method of claim 1, in a PMOS transistor, further comprising the steps of:

forming an anode region of said diode by an anti-punch through boron implant used for NMOS transistors;

providing an additional p-type implant using boron or indium with dose in the range of 1E12 to 1E15/cm$^2$ and implant energy in the range of 5 KeV to 200 KeV to form an anode region of said diode to insure a contiguous P type region for said diode in said N-well;

forming Ohmic contact to said anode region by a source/drain implant for said PMOS transistor; forming a cathode region of said diode by an n+ implant, which is a same implant as a source/drain implant for said NMOS transistor; and forming a silicide strap formed by in-situ self aligned silicidation of silicon by reacting it with titanium, cobalt, nickel, or any other suitable metal to short said anode of said diode with a well contact of said PMOS.

6. The method of claim 1, further comprising the steps of:

forming at least one integrated polysilicon diode by contact of n-type and p-type polysilicon to underlying silicon of opposite polarity; and either of preventing the formation of gate oxide underneath transistor gates and removing said gate oxide prior to deposition of polysilicon;

wherein voltage across said diode is adjusted by controlling doping profiles in silicon and programming area of said diode.

7. The method of claim 1, further comprising the step of:

forming a self-aligned diode control circuit by either of depositing polysilicon on top of regions where gate oxide has been prevented from growing during a thermal oxidation cycle, or where said gate oxide has been removed prior to deposition of polysilicon by an appropriate process step.

8. The method of claim 7, further comprising the steps of:

processing wafers through a typical CMOS process by implanting well regions and forming an isolation oxide;

forming an isolation region where NMOS transistors are to be formed;

making threshold implants;

growing silicon dioxide on selected areas by selectively implanting an area of silicon where said oxide is to be prevented from growth with a photoresist mask covering the rest of said wafer, by implanting said region with nitrogen atoms by ion implantation to a dose of 1×10$^{14}$/cm$^2$ to 1×10$^{16}$/cm$^2$ at an implant energy of 2 KeV to 50 KeV;

taking said wafer through a gate oxidation cycle to achieve the appropriate electrical characteristics of the transistor, wherein oxidation of implanted regions is prevented while oxidation of a silicon region on a remaining wafer takes place;

depositing a layer of polysilicon on said wafer; doping a polysilicon layer to form conductivity region n+ and p+ for NMOS and PMOS transistor gates, respectively; and forming an Ohmic electrical connection between a diode terminal and a well terminal with the help of a self-aligned silicide.

9. The method of claim 7, further comprising the step of:

damaging a gate oxide underneath polysilicon on top of a diode region by an appropriate dopant type to change an electrical characteristic of said oxide to allow it to conduct an electrical charge;

wherein for NMOS transistors a phosphorous or arsenic implant, and for PMOS transistors a boron implant, of dose 1×10$^{13}$ to 1×10$^{16}$ atoms/cm$^2$ with an energy ranging from 25 KeV to 200 KeV is used to implant a polysilicon layer and damage an underlying gate oxide in a region of said diode to form an electrically conducting electrode.

10. The method of claim 7, further comprising the steps of:

forming a lateral diode in a line of polysilicon between n+ and p+ polysilicon regions, where electrical characteristics of said polysilicon diode are controlled by lateral isolation between n+ and p+ regions in polysilicon;

forming said p+ and the n+ regions of polysilicon by source/drain implants of NMOS and PMOS transistors;

doping said polysilicon is doped with phosphorous, arsenic, or antimony to a dose in the range of 5×10$^{14}$ to 5×10$^{16}$/cm$^2$ at an energy in the range of 5 KeV to 200 KeV; and forming said p+ region by doping polysilicon with boron, or indium to a dose in the range of 1×10$^{14}$ to 5×10$^{16}$/cm$^2$ an energy in the range of 5 KeV to 200 KeV.

11. The method of claim 7, further comprising the steps of:

uniformly implanting a polysilicon layer in a region of said diode by an N-type P-type dopant, as the case may be, with a lower implant dose, such as 1×10$^{13}$–1×10$^{15}$ atoms/cm$^2$ of appropriate doping species; and implanting a desired region for formation of an anode (cathode) with a heavier dose of the P(N) type species with a dose of 2×10$^{13}$/cm$^2$–5×10$^{16}$ atoms/cm$^2$.

12. The method of claim 7, further comprising the steps of:

forming at least one Schottky diode at an interface of a layer of a metallic material, such as titanium nitride, and n-type or p-type silicon;

wherein said Schottky diode is formed on n-type and p-type silicon by selecting a work function of a metallic layer and adjusting a Fermi level of silicon by control of doping; and wherein voltage across said diode is adjusted by changing doping in the well and the diode area.

* * * * *